United States Patent [19]

Azar

[11] Patent Number: 5,107,397
[45] Date of Patent: Apr. 21, 1992

[54] TECHNIQUE FOR COMPONENT PLACEMENT AND ORIENTATION TO IMPROVE CIRCUIT PACK COOLING

[75] Inventor: Kaveh Azar, Westwood, Mass.
[73] Assignee: AT&T Bell Laboratories, Murray Hill, N.J.
[21] Appl. No.: 629,913
[22] Filed: Dec. 19, 1990
[51] Int. Cl.⁵ ............................................. H05K 7/20
[52] U.S. Cl. .................................. 361/384; 361/381; 361/383; 174/15.1; 165/80.3
[58] Field of Search ............... 361/381, 383, 384, 385; 174/15.1, 16.1; 165/80.3; 357/81

[56] References Cited

U.S. PATENT DOCUMENTS

| | | | |
|---|---|---|---|
| 4,233,644 | 11/1980 | Hwang et al. | 361/384 |
| 4,837,663 | 6/1989 | Zushi et al. | 361/384 |
| 4,860,163 | 8/1989 | Sarath | 361/384 |

FOREIGN PATENT DOCUMENTS 0128499  5/1999  Japan ................................. 361/383

Primary Examiner—Leo P. Picard
Assistant Examiner—Young S. Whang
Attorney, Agent, or Firm—T. Stafford

[57] ABSTRACT

A method for arranging components to be mounted on circuit packs to achieve improved cooling is disclosed. In accordance with one aspect of the invention, components are arranged such that the longer dimension of each component is substantially parallel to the flow of a heat carrier as it streams from an inlet to an outlet. In accordance with another aspect of the invention, those components having larger aspect ratios are substantially placed near the outlet via which the heat carrier is removed.

16 Claims, 4 Drawing Sheets

TECHNIQUE FOR COMPONENT PLACEMENT AND ORIENTATION TO IMPROVE CIRCUIT PACK COOLING

TECHNICAL FIELD

This invention relates to the cooling of components on a circuit pack and, more particularly, to arranging the components to achieve improved cooling.

BACKGROUND OF THE INVENTION

It is well known that the components (modules) mounted on circuit packs contained within an enclosure require cooling. Typically, this is accomplished by employing a fluid heat carrier (gaseous or liquid) which passes over and around the components so as to remove their excess heat. The heat carrier, most often atmospheric air, is supplied to the cavity within the enclosure via an inlet. The heat carrier is permitted to reach the individual components where it absorbs their excess heat and, thereafter, is removed via an outlet typically located opposite from the inlet. The motion of the heat carrier is typically forced, either by injecting it at the inlet or employing suction to remove it from the outlet.

Historically, in the design of circuit packs, little or no consideration was given to the implications of component placement on cooling efficiency. Primary consideration instead was given to routability and manufacturability of the circuit pack. As a consequence, components were placed indiscriminantly on the circuit board regardless of their aspect (height to width) ratio or size. Such placement typically resulted in poor removal of heat from the components comprising the circuit packs. Indeed, such placement could result in a further convective heating of particular components as they were subjected to heat carried to them by the heat carrier which had already been removed from other components. Such poor removal of heat or excessive heating can cause premature component failure.

SUMMARY OF THE INVENTION

The difficulties with the cooling of circuit pack components created by prior component layout arrangements are avoided, in accordance with one aspect of the invention, by arranging the orientation of the components such that the longer dimension of each component is substantially parallel to the flow of the heat carrier as it streams from the inlet to the outlet. In accordance with another aspect of the invention, improved cooling is achieved by placing thoses components having larger aspect ratios substantially near the outlet via which the heat carrier is removed.

BRIEF DESCRIPTION OF THE DRAWINGS

In the Drawing.

Shown in FIG. 1 is an exemplary prior art circuit pack.

DETAILED DESCRIPTION

Figure 1:
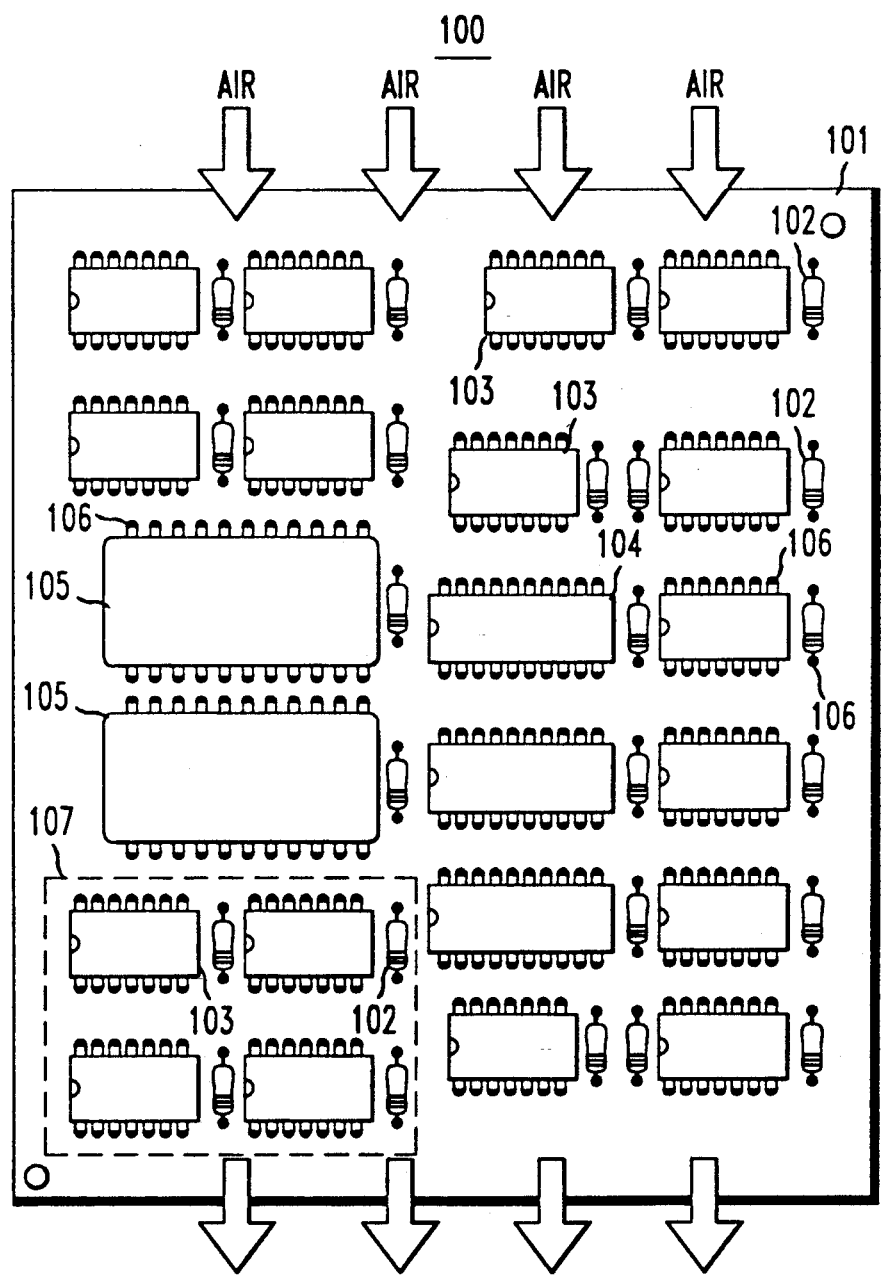

Shown in FIG. 1 is exemplary prior art circuit pack 100 comprised of circuit board 101 and circuit components of four different sizes including: tiny components 102, small components 103, medium components 104 and large components 105. For each component to be placed on circuit board 101 there is a set of pads 106 that is used to define the location of the component as well as to aid in securing the component to circuit board 101. Each of pads 106 is typically made of copper via standard circuit board manufacturing techniques and may be of any shape or size desired by the implementor. Additionally, for through-hole technology circuit packs, a hole is typically drilled through each of pads 106.

Figure 2:
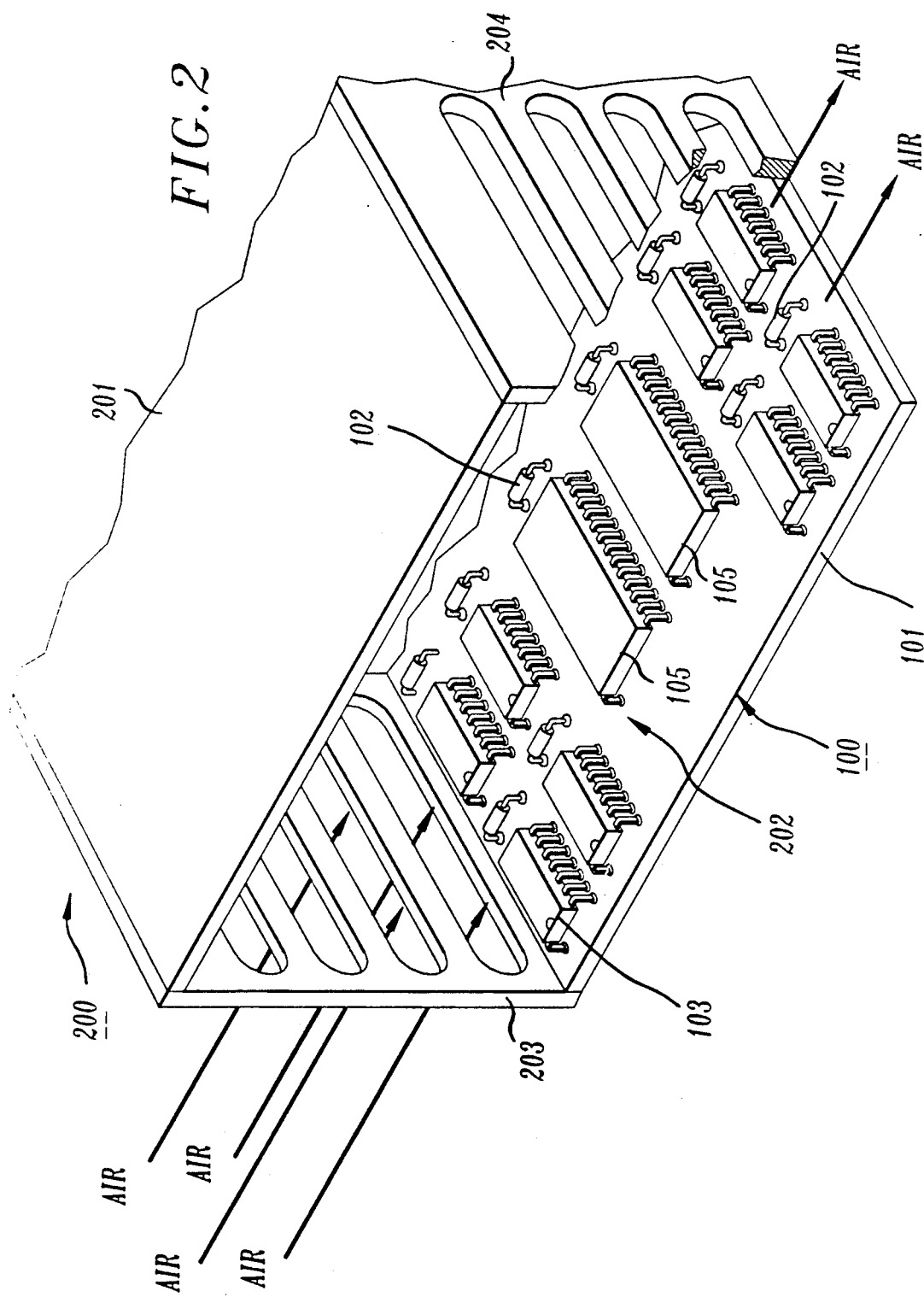
FIG. 2 depicts an alternate view of a portion prior art circuit pack if it were placed within a housing or a circuit pack carrier.

FIG. 2 depicts an alternate view of a portion prior art circuit pack 100 (FIG. 1) if it were placed within exemplary housing 200. Housing 200 could be, without limitation, a stand alone box type structure or a part of a circuit pack carrier (shelf). Although prior art circuit pack 100 is shown as an integral structural part of housing 200 this is not necessarily so since prior art circuit pack 100 may simply be placed within housing 200. Exemplary roof 201 can be, without limitation, a wall of housing 200, one side of another circuit pack or any other structural part of a housing. Despite being depicted herein as a flat planar surface, roof 201 can be any shape that when placed opposite to circuit board 101 will form channel 202 which will substantially constrain a heat carrier so as to flow from inlet 203 to outlet 204.

The components of prior art circuit pack 100 project themselves into channel 202 in accordance with their respective heights h. Height h, for each component, is defined as the vertical distance between the highest and lowest point of that component as it is mounted on the circuit board and employing the circuit board as defining the horizontal plane. Additionally, width w is defined as the length measurement of the side of the component that is perpendicular to the direction of the fluid heat carrier.

An issue that is common to typical circuit packs is the presence of multiple components in a row. As shown in FIG. 1 and FIG. 2 components 103 through 105 are oriented with their longest side perpendicular to the direction of flow of the heat carrier. Often, tiny components 102 are constrained in their placement by factors other than cooling, e.g., maximum allowable conductor length between one of tiny components 102 and a larger component to which it is interconnected. Additionally, large components 105 are located in the center of the path of the heat carrier.

The heat carrier, in this example air, is forced through inlet 203, flows over the surface of prior art circuit 100 and components 102 through 105 mounted thereon, and is removed via outlet 204. A stagnation region is created by large components 105 grouped in the central area of prior art circuit pack 100. This stagnation region affects the cooling of any components downstream from large components 105, e.g., group 107 (FIG. 1) which includes several of tiny components 102 and small components 103, by preventing the heat carrier from effectively reaching them. Also, because the components are oriented with their longer side perpendicular to the flow, there is an increased flow interaction between the components which results from a larger radius of flow dispersion. The flow spreading, i.e., dispersion radius, by any component is approximately twice the length of its side perpendicular to the direction of the flow. Therefore, components with a larger h/w (aspect) ratio will generate less disturbance in the channel. Again, components that have a small ratio of aspect ratios with respect to their neighboring components, e.g., tiny components 102, typically have a negligible impact on flow stagnation of the heat carrier and therefore, their placement on the circuit board can typically be ignored. This is useful since in many situations tiny components 102 are constrained in their placement by factors other than cooling.

Figure 3:
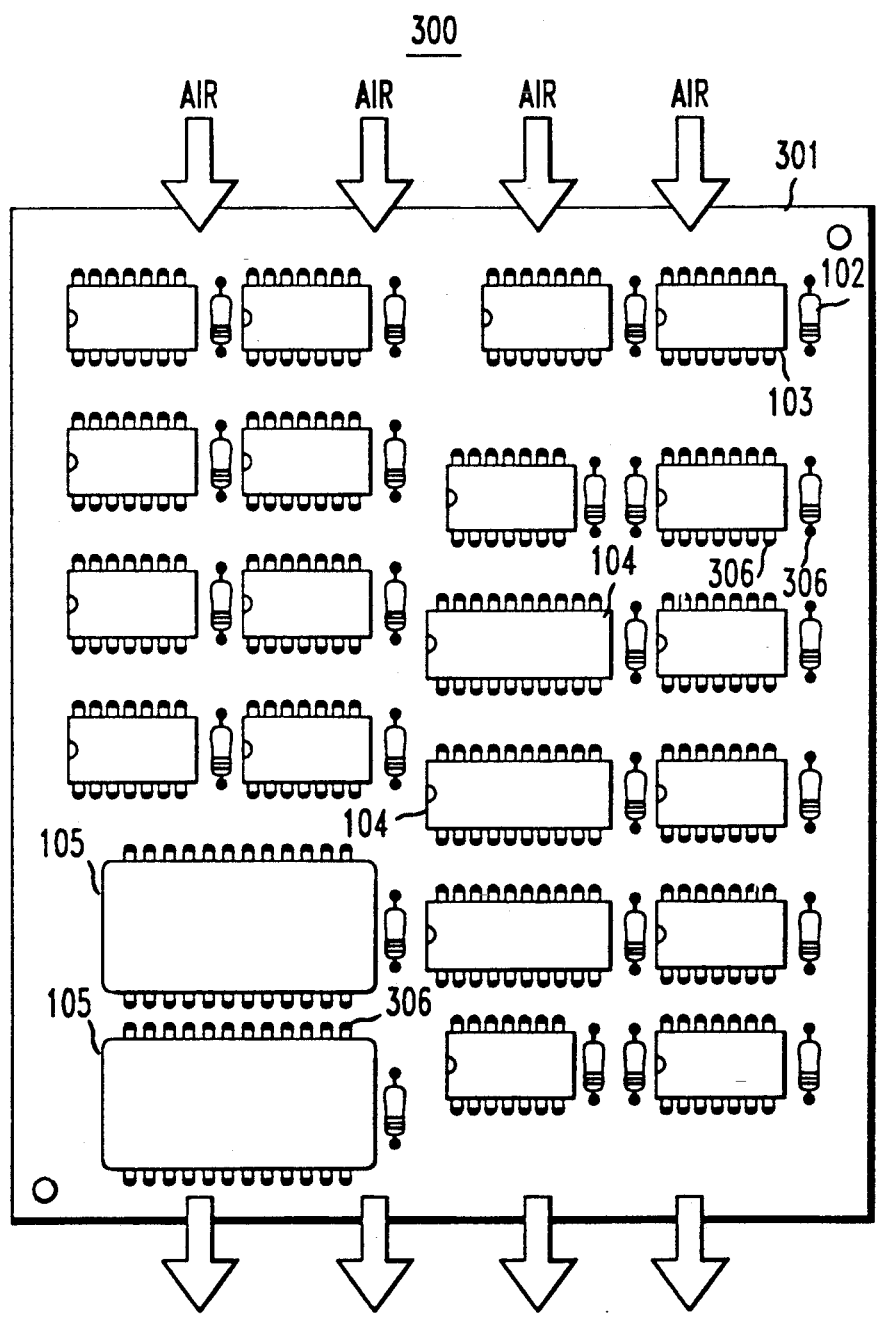
FIG. 3 shows a circuit pack carrying the same circuit components as the prior art circuit pack but arranged in accordance with an aspect of the invention.

Shown in FIG. 3, in accordance with an aspect of the invention, is exemplary circuit pack 300 comprised of circuit board 301 and the same circuit components in four different sizes as were mounted on prior art circuit pack 100, including: tiny components 102, small components 103, medium components 104 and large components 105. The components are mounted to and arranged by pads 306. Circuit pack 300 replaces prior art circuit pack 100 in housing 200 (FIG. 2) for purposes of this example. Again, the components with large aspect ratios tend to dictate the flow by creating strong cross channel pressure gradients. Note that a downstream stagnation region is again created by large components 105 that is similar to the stagnation region created by large components 105 of prior art circuit pack 100 (FIG. 1). Because, in accordance with an aspect of the invention, large components 105 are placed on circuit pack 300 substantially near outlet 204 (FIG. 2) this region of fluid flow stagnation is moved closer to the outlet. There are therefore no components downstream from large components 105 whose cooling is detrimentally affected by the stagnation region.

Figure 4:
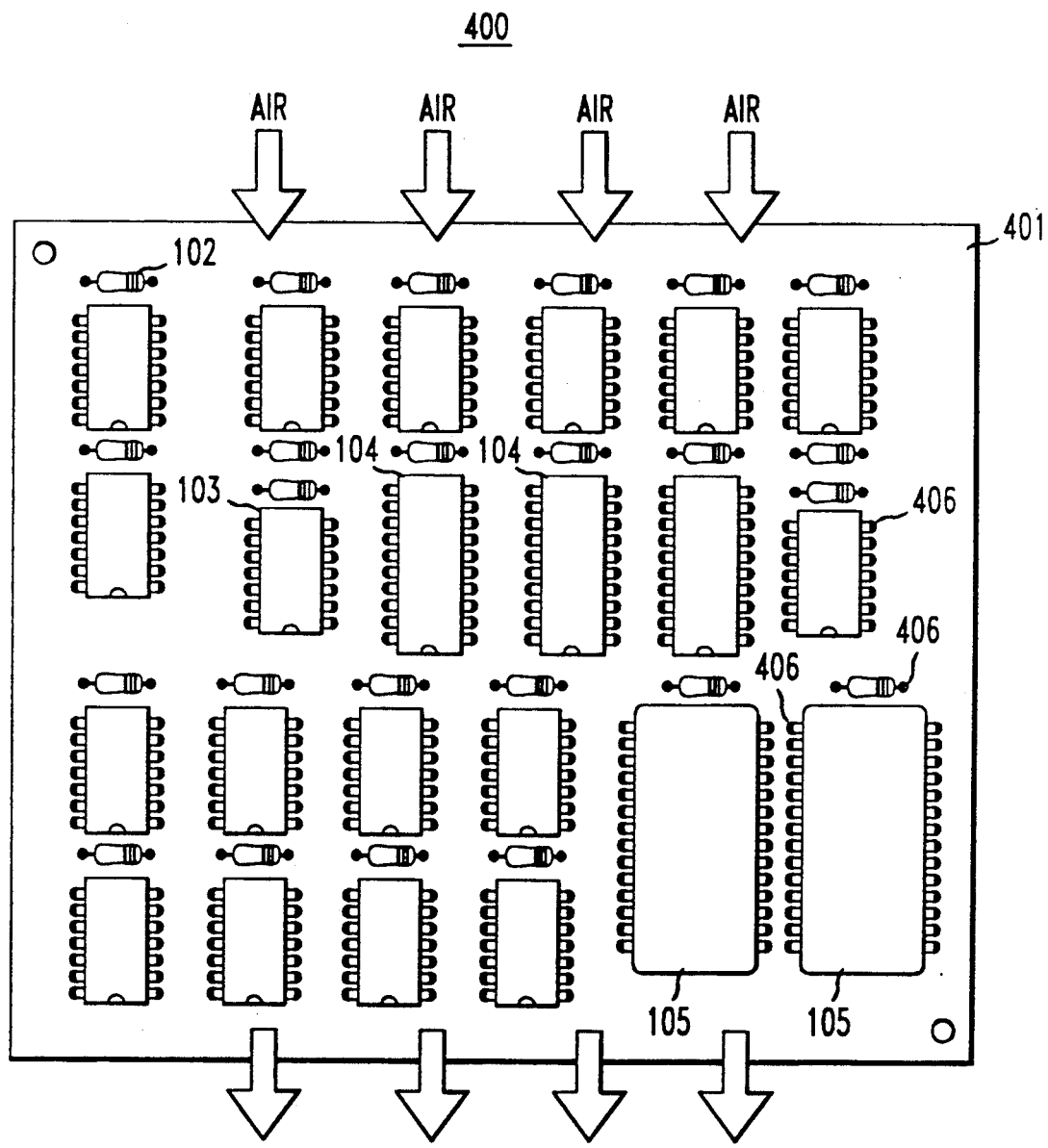
FIG. 4 shows a circuit pack carrying the same circuit components as the prior art circuit pack but arranged in accordance with another aspect of the invention.

Shown in FIG. 4, in accordance with an aspect of the invention, is exemplary circuit pack 400 comprised of circuit board 401 and the same circuit components in four different sizes as were carried by prior art circuit pack 100 and circuit pack 300. The components are mounted to and arranged by pads 406. Also, in this example, circuit pack 400 replaces prior art circuit pack 100 in housing 200 (FIG. 2). All the components of circuit pack 400, except tiny components 102, are arranged with their shorter side perpendicular to the flow of air from the inlet. This improves cooling because the aspect ratio of each of components 103 through 105 is increased, thereby resulting in less disturbance in the flow of the heat carrier.

Advantages of arranging the components as described above are more effective heat removal due to improved exposure of the components to the flow of the heat carrier thereby resulting in cooler operating temperatures for the components. Cooler operating components yield improvements in system performance and reliability. Although presented in an exemplary fashion employing circuit boards and components mounted thereon, the disclosed arrangement techniques are not intended to be so limited as they may be employed in other applications where the cooling of items on a planar surface is to be effectuated via a heat carrier. This general applicability will be easily perceived by one skilled in the art. Such other applications include, without limitation: arranging items stocked on refrigerator shelves, arrangement of heat sinks or fins for the removal of heat from a set of circuit packs and the arrangements of system modules in a carrier bay or cabinet.

I claim:

1. Apparatus providing enhanced cooling for items mounted theron when said apparatus is cooled by other apparatus including an inlet for supplying a heat carrier, an outlet for removing said heat carrier, and said hear carrier flowing from said inlet over and around said items and to said outlet, said apparatus comprising:
   a board; and
   means adapted for mounting and organizing said items on said board, said means for mounting and organizing arranged so as to substantially place ones of said items with successively smaller aspect ratios at greater distances from said outlet.

2. The apparatus as defined in claim 1 wherein said means adapted for mounting and organizing are further arranged so as to substantially orient said items such that a longest dimension of each of said items is parallel to said flow of said heat carrier as it flows from said inlet to said outlet.

3. The apparatus as defined in claim 1 wherein said board is a circuit board and said items are circuit components.

4. The apparatus as defined in claim 3 wherein said means adapted for mounting and organizing are conductive pads for affixing said circuit components to said circuit board.

5. Apparatus providing enhanced cooling for items mounted thereon when said apparatus is cooled by other apparatus including an inlet for supplying a heat carrier, an outlet for removing said heat carrier, and said heat carrier flowing from said inlet over and around said items and to said outlet, said apparatus comprising:
   a board; and
   means adapted for mounting and organizing said items on said board, said means for mounting and organizing arranged so as to substantially orient said items such that a longest dimension of each of said items is parallel to said flow of said heat carrier as it flows from said inlet to said outlet.

6. The apparatus as defined in claim 5 wherein said board is a circuit board and said items are circuit components.

7. The apparatus as defined in claim 5 wherein said means adapted for mounting and organizing are conductive pads for affixing said circuit components to said circuit board.

8. A method for causing items to experience enhanced cooling when said items are located within apparatus adapted for cooling them, said apparatus including an inlet for supplying a heat carrier and an outlet for removing said heat carrier, said inlet and said outlet being arranged such that said heat carrier flows from said inlet over and around said items when said items are located within said apparatus and to said outlet, said method comprising the steps of:
   placing said items on a planar structure; and
   arranging said items on said planar structure so that ones of said items having successively smaller aspect ratios are substantially placed at greater distances from said outlet when said planar structure having said items placed thereon is inserted within said apparatus.

9. The method as defined in claim 8 wherein said planar structure is a circuit board and said items are circuit components.

10. The method as defined in claim 8 further including the step of substantially orienting said items such that a longest dimension of each of said items is parallel to said flow of said heat carrier as it flows from said inlet to said outlet.

11. A method for causing items to experience enhanced cooling when said items are located within apparatus adapted for cooling them, said apparatus including an inlet for supplying a heat carrier and an outlet for removing said heat carrier, said inlet and said outlet being arranged such that said heat carrier flows from said inlet over and around said items when said items are located within said apparatus and to said outlet, said method comprising the steps of:
  placing said items on a planar structure; and
  orienting said items on said planar structure such that a longest dimension of each of said items is parallel to said flow of said heat carrier as it flows from said inlet to said outlet when said planar structure having said items placed thereon is inserted within said apparatus.

12. The method as defined in claim 11 wherein said planar structure is a circuit board and said items are circuit components.

13. A method for causing items to experience enhanced cooling when said items are located within apparatus adapted for cooling them, said apparatus including an inlet for supplying a heat carrier and an outlet for removing said heat carrier, said inlet and said outlet being arranged such that said heat carrier flows from said inlet over and around said items when said items are located within said apparatus and to said outlet, said method comprising the steps of:
  arranging means adapted for mounting and organizing said items on a planar structure, so as to substantially prescribe the placement of ones of said items with successively smaller aspect ratios at greater distances from said outlet if said planar structure were inserted in said apparatus; and
  placing at least one of said items on said planar structure arranged in accordance with the arrangement prescribed by said means adapted for mounting and organizing.

14. The method as defined in claim 13 further including the step of orienting said means adapted for mounting and organizing said items on said planar structure so as to substantially prescribe the orientation of said items such that a longest dimension of each of said items would be parallel to said flow of said heat carrier as it flows from said inlet to said outlet if said planar structure were inserted in said apparatus.

15. A method for causing items to experience enhanced cooling when said items are located within apparatus adapted for cooling them, said apparatus including an inlet for supplying a heat carrier and an outlet for removing said heat carrier, said inlet and said outlet being arranged such that said heat carrier flows from said inlet over and around said items when said items are located within said apparatus and to said outlet, said method comprising the steps of:
  orienting means adapted for mounting and organizing said items on a planar structure, so as to substantially prescribe the orientation of said items such that a longest dimension of each of said items would be parallel to said flow of said heat carrier as it flows from said inlet to said outlet if said planar structure were inserted in said apparatus; and
  placing at least one of said planar structure arranged in accordance with the orientation prescribed by said means adapted for mounting and organizing.

16. The method as defined in claim 8, 10, 11, 13, 14 or 15 further including the step of placing said planar structure with at least one of said items placed thereon into said apparatus.

* * * * *